United States Patent
Xia et al.

(10) Patent No.: US 12,112,890 B2
(45) Date of Patent: Oct. 8, 2024

(54) TOP MAGNETS FOR DECREASED NON-UNIFORMITY IN PVD

(71) Applicant: Applied Materials, Inc., Santa Clara, CA (US)

(72) Inventors: Borui Xia, San Jose, CA (US); Anthony Chih-Tung Chan, Sunnyvale, CA (US); Shiyu Yue, Sunnyvale, CA (US); Wei Lei, Campbell, CA (US); Aravind Miyar Kamath, San Jose, CA (US); Mukund Sundararajan, Bangalore (IN); Rongjun Wang, Dublin, CA (US); Adolph Miller Allen, Oakland, CA (US)

(73) Assignee: Applied Materials, Inc., Santa Clara, CA (US)

( * ) Notice: Subject to any disclaimer, the term of this patent is extended or adjusted under 35 U.S.C. 154(b) by 475 days.

(21) Appl. No.: 17/478,047

(22) Filed: Sep. 17, 2021

(65) Prior Publication Data
US 2023/0088552 A1 Mar. 23, 2023

(51) Int. Cl.
C23C 14/35 (2006.01)
H01F 7/18 (2006.01)

(52) U.S. Cl.
CPC ............. H01F 7/18 (2013.01); C23C 14/358 (2013.01)

(58) Field of Classification Search
CPC ....... H01F 7/18; H01F 7/0273; C23C 14/358; C23C 14/021; C23C 14/35; H01J 37/3266; H01J 37/32669; H01J 37/3402; H01J 37/3405; H01J 37/3408
See application file for complete search history.

(56) References Cited

U.S. PATENT DOCUMENTS

| | | | | |
|---|---|---|---|---|
| 4,461,688 A | * | 7/1984 | Morrison, Jr. | H01J 37/3408 204/192.12 |
| 5,079,481 A | * | 1/1992 | Moslehi | H01J 37/32623 118/723 MR |
| 6,179,976 B1 | * | 1/2001 | D'Souza | C23C 14/08 204/192.15 |
| 6,236,163 B1 | * | 5/2001 | Maishev | H01J 27/143 118/723 CB |
| 2002/0148725 A1 | * | 10/2002 | Subramani | H01J 37/3405 204/298.12 |

(Continued)

FOREIGN PATENT DOCUMENTS

KR 20190062574 A 6/2019
WO 2016018505 A1 2/2016

OTHER PUBLICATIONS

PCT International Search Report and Written Opinion in PCT/US2022/034898 dated Jan. 13, 2023, 10 pages.

*Primary Examiner* — James Lin
*Assistant Examiner* — Patrick S Ott
(74) *Attorney, Agent, or Firm* — Servilla Whitney LLC

(57) ABSTRACT

Magnet assemblies comprising a housing with a top plate each comprising aligned openings are described. The housing has a bottom ring and an annular wall with a plurality of openings formed in the bottom ring. The top plate is on the housing and has a plurality of openings aligned with the plurality of openings in the bottom ring of the housing. The magnet assembly may also include a non-conducting base plate and/or a conductive cover plate. Methods for using the magnet assembly and magnetic field tuning are also described.

19 Claims, 10 Drawing Sheets

(56) References Cited

U.S. PATENT DOCUMENTS

| | | | |
|---|---|---|---|
| 2003/0089601 A1* | 5/2003 | Ding | C23C 14/358 |
| | | | 257/E21.585 |
| 2007/0108041 A1* | 5/2007 | Guo | H01J 37/3408 |
| | | | 204/192.1 |
| 2007/0261957 A1* | 11/2007 | Takahashi | C23C 14/352 |
| | | | 204/298.16 |
| 2008/0127887 A1 | 6/2008 | Leung et al. | |
| 2012/0073965 A1* | 3/2012 | Pei | H01J 37/3455 |
| | | | 204/298.22 |
| 2012/0193226 A1 | 8/2012 | Beers | |
| 2012/0193227 A1 | 8/2012 | Tryon | |
| 2014/0262767 A1 | 9/2014 | Subramani et al. | |
| 2015/0075970 A1 | 3/2015 | Miller | |
| 2015/0240349 A1* | 8/2015 | Grannen | H01J 37/3417 |
| | | | 204/192.15 |
| 2016/0168687 A1* | 6/2016 | Ramalingam | H01J 37/34 |
| | | | 204/192.12 |
| 2020/0090914 A1 | 3/2020 | Miller | |

\* cited by examiner

TOP MAGNETS FOR DECREASED NON-UNIFORMITY IN PVD

TECHNICAL FIELD

Embodiments of the disclosure generally relate to apparatus and methods for improving physical vapor deposition (PVD) uniformity. In particular, embodiments of the disclosure relate to apparatus and methods for positioning and tuning magnets on top of a PVD chamber.

BACKGROUND

Conventional sputtering preclean using argon ($Ar^+$) ions frequently results in high film non-uniformity. This film non-uniformity is especially prevalent in low bias power processes. For example, non-uniformity of some silicon oxide processes can be greater than 7% (1σ value) and range greater than 8 Å for TiN.

Additionally, with current hardware limits, the etch rates show significant center-high/edge-low profile with the bias voltage decreasing from the center to edge of the pedestal.

Current solutions for non-uniformity improvement include optimization of the bias/source ratio with a minimum non-uniformity observed at around 1 (bias power equal to the source power). However, the high energy $Ar^+$ ions can result in metal re-sputtering and damage dielectric films on the substrate.

Accordingly, there is a need in the art for apparatus and methods to improve non-uniformity in etch processes.

SUMMARY

One or more embodiments of the disclosure are directed to magnet assemblies comprising a housing having a bottom ring with a top surface and a bottom surface defining a thickness of the bottom ring, an inner diameter with an inner peripheral face and an outer diameter with an outer peripheral face. The bottom ring has a plurality of openings extending through the thickness of the bottom ring, and a housing annular wall extending a height from the top surface of the bottom ring. The housing annular wall has an inner diameter with an inner peripheral face and an outer diameter with an outer peripheral face defining a wall thickness.

Additional embodiments of the disclosure are directed to magnet assemblies comprising a base plate, a housing, a top plate and a cover plate. The base plate has a top surface and a bottom surface defining a thickness of the base plate. The housing is on the base plate. The housing has a bottom ring with a top surface and a bottom surface defining a thickness of the bottom ring, an inner diameter with an inner peripheral face and an outer diameter with an outer peripheral face. The bottom ring has a plurality of openings extending through the thickness of the bottom ring. A housing annular wall extends a height from the top surface of the bottom ring. The housing annular wall has an inner diameter with an inner peripheral face and an outer diameter with an outer peripheral face defining a wall thickness. The top plate is on the housing. The top plate has a top surface and a bottom surface defining a thickness of the top plate, and an inner diameter with an inner peripheral face and an outer diameter with an outer diameter face. The top plate has a plurality of openings extending through the thickness of the top plate. The plurality of openings aligned are with the plurality of openings in the bottom ring of the housing. The cover plate has a cover plate top wall and a cover plate annular wall. The cover plate top wall has a top surface and a bottom surface defining a thickness of the cover plate top wall. The cover plate annular wall has an inner diameter with an inner diameter face and an outer diameter with an outer diameter face defining a wall thickness. The cover plate annular wall extends a height from the bottom surface of the cover plate top wall and has an outer diameter less than the inner diameter of the housing annular wall.

BRIEF DESCRIPTION OF THE DRAWINGS

So that the manner in which the recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments

DETAILED DESCRIPTION

Figure 1:
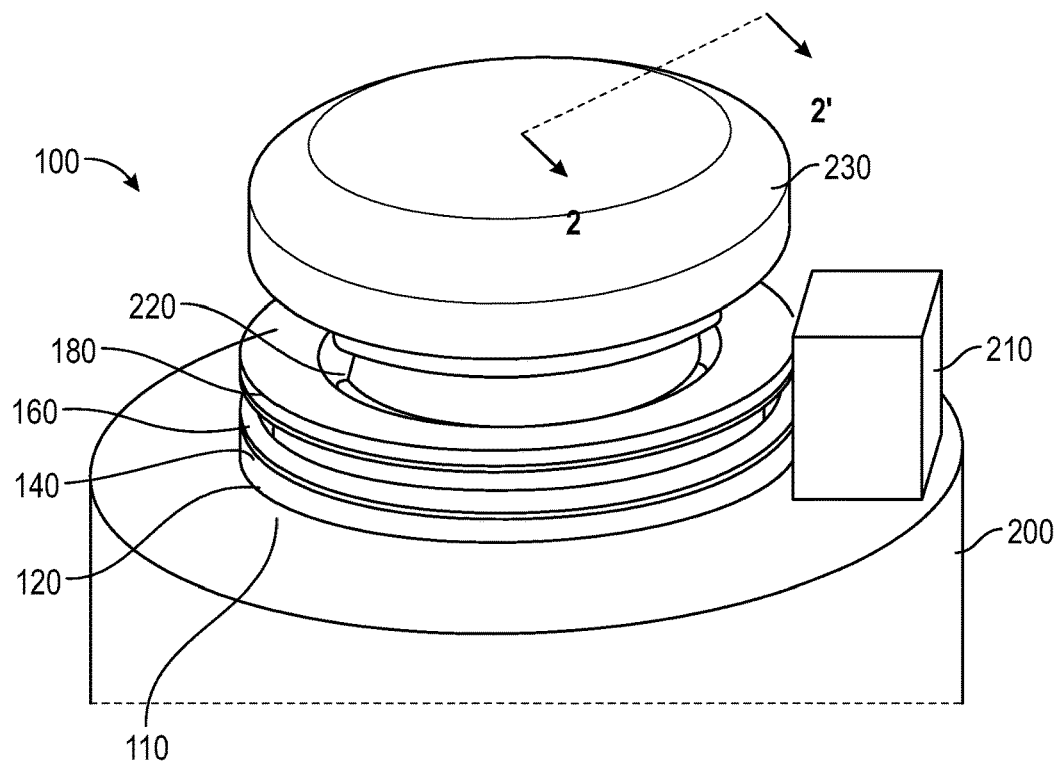
FIG. 1 is an isometric view of a magnet assembly on top of a physical vapor deposition chamber according to one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates.

According to one or more embodiments, the term "on", with respect to a film or a layer of a film, includes the film or layer being directly on a surface, for example, a substrate surface, as well as there being one or more underlayers between the film or layer and the surface, for example the substrate surface. Thus, in one or more embodiments, the phrase "on the substrate surface" is intended to include one or more underlayers. In other embodiments, the phrase "directly on" refers to a layer or a film that is in contact with a surface, for example, a substrate surface, with no intervening layers. Thus, the phrase "a layer directly on the substrate surface" refers to a layer in direct contact with the substrate surface with no layers in between.

Some embodiments of the disclosure provide apparatus and methods in which optimization of the bias/source ratio is not necessary. With tuning the top magnets, the etch profile can be changed significantly. Some embodiments decrease non-uniformity by positioning magnets on top of the chamber. A constant external magnetic field can be introduced to the process chamber to optimize the $Ar^+$ ion distribution. The external magnetic field can be adjusted to improve the Ar sputter etch rate non-uniformity (NU %). In an exemplary embodiment, non-uniformity of current method can be reduced to <4%.

In some embodiments, the magnet assembly can be installed and optimized (tuned) without opening the process chamber or changing other chamber configurations. With the result that the etch profile changes from center-high/edge-low to center-low/edge-high with strong magnetic field applied. The numbers, height, radius and polarity of the magnets can be adjusted to flatten the profile with NU % improvement. In some embodiments, the non-uniformity of a known method is decreased from about 9% to about 2%.

The hardware components of some embodiments are discussed further below. In general, a plastic (e.g., Nylon) base plate and shim hold the top magnet ring to the chamber cap and allow height adjustment. The housing, top plate and cover plate support the magnets. The top plate has holes (e.g., 48) for tuning the number of magnets with stainless steel to hold the magnets in aluminum for easy assembly. The magnets are positioned on the top plate with attracting force and other parts are held by mechanical fasteners (e.g., screws).

Figure 2:
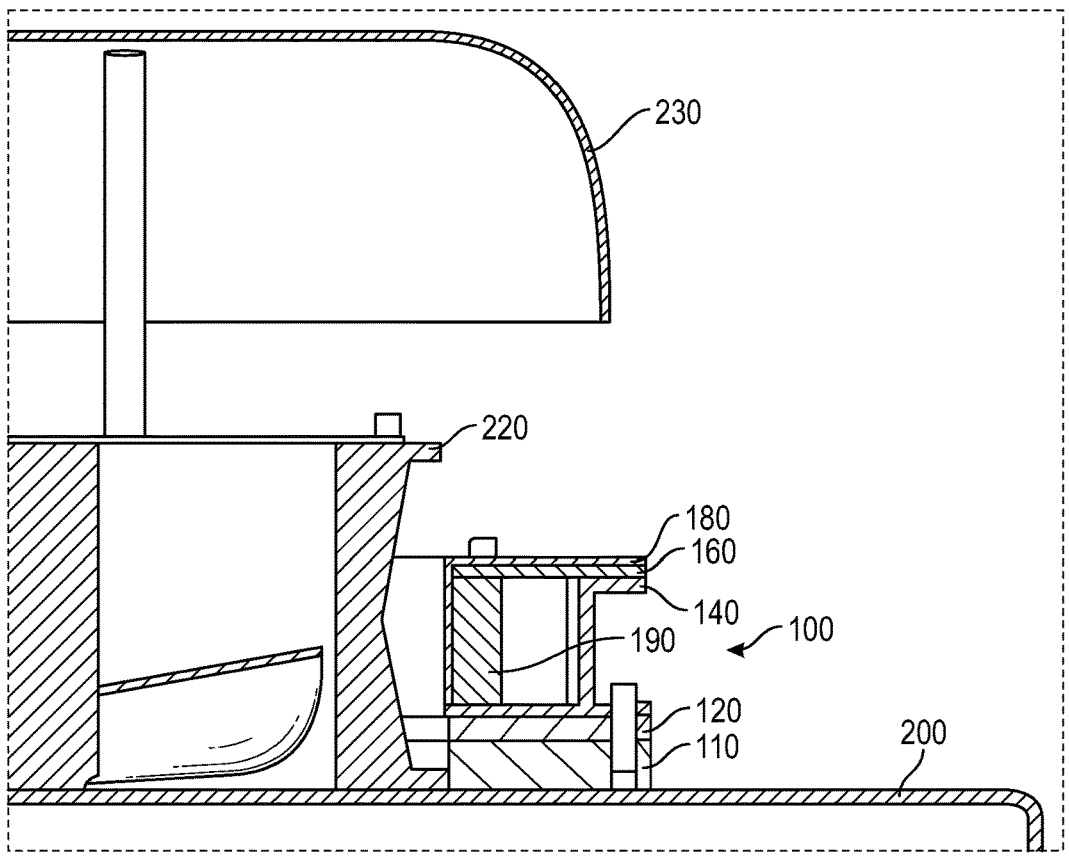
FIG. 2 shows a partial cross-sectional view of the magnet assembly on top of the physical vapor deposition chamber of FIG. 1 taken along line 2-2'.

With reference to FIGS. 1 and 2, one or more embodiments of the disclosure are directed to magnet assemblies 100. In particular, the magnet assemblies 100 are configured to be used with a physical vapor deposition (PVD) chamber 200. FIG. 1 illustrates a portion of a top of a PVD chamber 200 with a magnet assembly 100 according to one or more embodiment of the disclosure. FIG. 2 shows a partial cross-sectional view of a portion of the PVD chamber 200 and magnet assembly 100 taken along line 2-2'. The PVD chamber 200 illustrated includes a fan 220 with a fan cover 230 and an interlock switch 210. The magnet assembly 100 illustrated extends around the fan 220. While embodiments of the disclosure are described with respect to a PVD chamber 200, the skilled artisan will recognize that the magnet assembly 100 is not limited to use with PVD chambers and can be incorporated into other equipment in which a tunable magnet array is employed.

Figure 3:
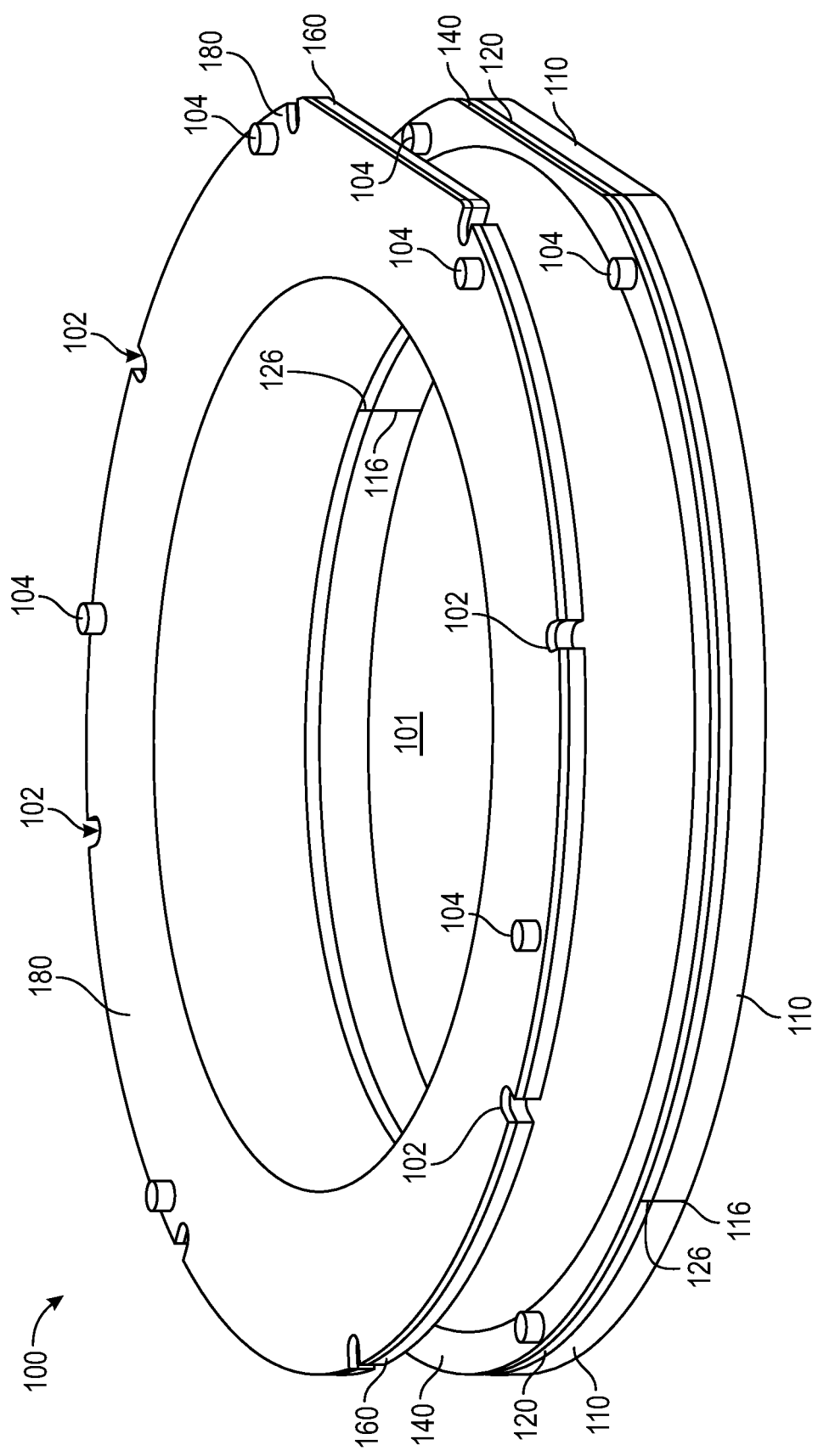
FIG. 3 shows an isometric view of a magnet assembly according to one or more embodiment of the disclosure.
Figure 4:
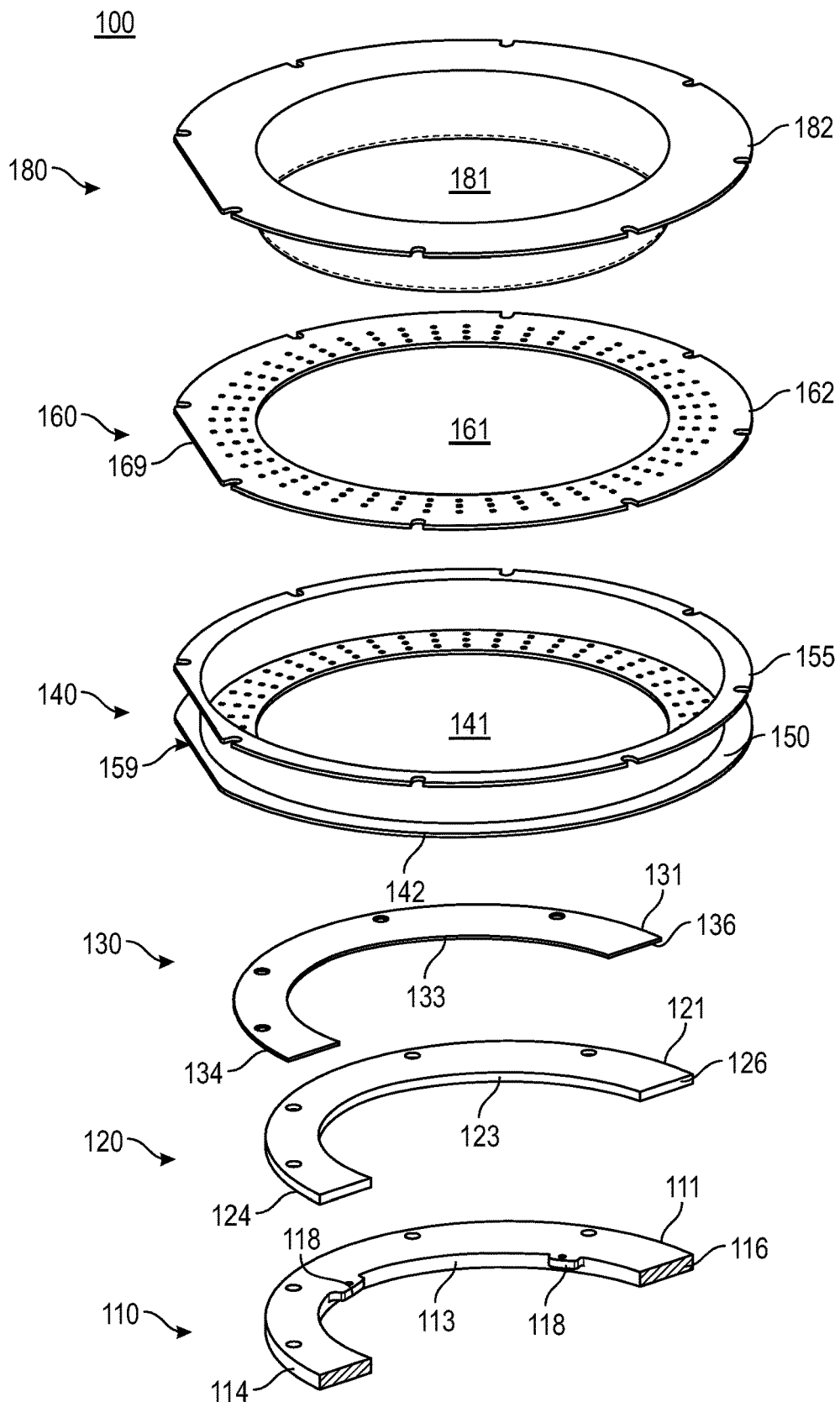
FIG. 4 shows an exploded view of a magnet assembly according to one or more embodiment of the disclosure.

FIG. 3 illustrates an embodiment of a magnet assembly 100, for example, like that shown in FIGS. 1 and 2. FIG. 4 illustrates an exploded view of the components of the magnet assembly 100, in accordance with one or more embodiment of the disclosure. The magnet assembly 100 illustrated in FIGS. 3 and 4 is a generally ring-shaped structure with an open interior 101 and includes a base plate 110, a shim 120, a shim 130 (shown in FIG. 4), a housing 140, a top plate 160 and a cover plate 180 arranged in a stack configuration. The illustrated embodiment includes various notches 102 and alignment pins 104 for assembly purposes.

Figure 5:
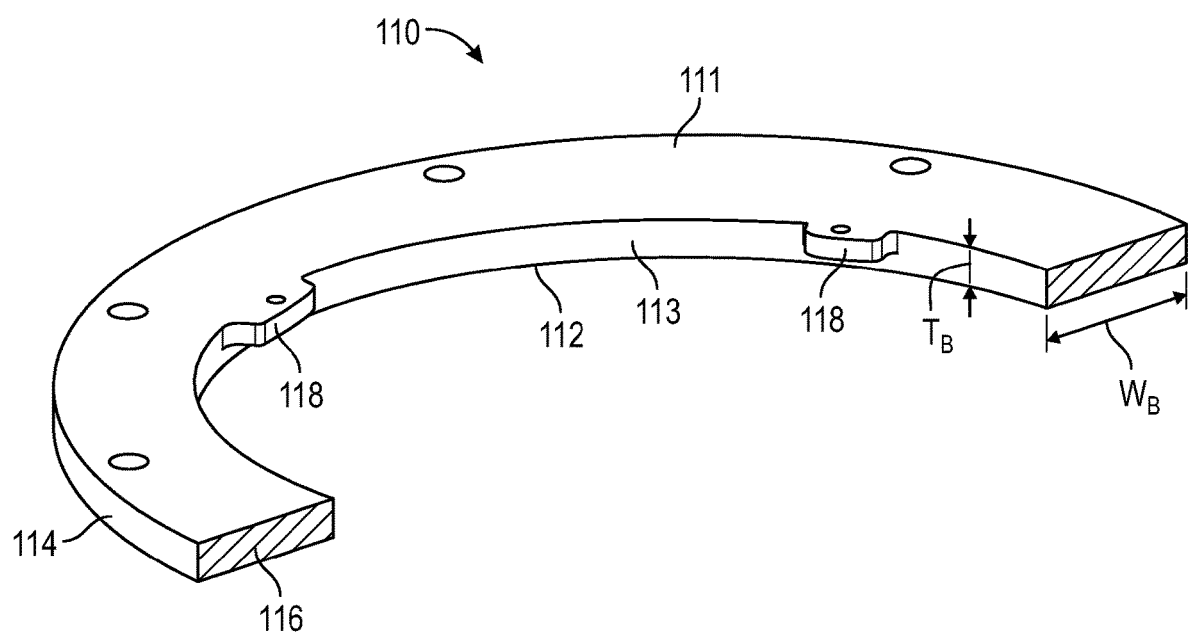
FIG. 5 shows an isometric view of a portion of a base plate of a magnet assembly according to one or more embodiment of the disclosure.

FIG. 5 illustrates a portion of a base plate 110 in accordance with one or more embodiment of the disclosure. The base plate 110 has a top surface 111 and a bottom surface 112 that define a thickness $T_B$ of the base plate 110. The base plate 110 includes an inner diameter with an inner peripheral face 113 and an outer diameter with an outer peripheral face 114 that define a width $W_B$ of the base plate 110.

In some embodiments, the base plate 110 comprises more than one piece. For example, the embodiment illustrated in the Figures has a two-part base plate 110 that can be assembled so that the end faces 116 are positioned to touch, or nearly touch, to form a generally ring-shaped base component. The split piece base plate of some embodiments allows for easy retrofitting of the magnet assembly 100 onto existing process chambers so that components do not need to be removed from the process chambers during assembly.

In some embodiments, the base plate 110 comprises at least two portions. For example, two base plates 110 like that shown in FIG. 5 can be connected to form a single base plate 110. In some embodiments, the base plate 110 comprises three or four pieces that are connected to form a single base plate 110.

The embodiment illustrated in FIG. 5 includes connection flanges 118 that extend inwardly from the inner peripheral face 113. The connection flanges 118 provide a region for a physical fastener to be employed to fix the base plate 110 to the process chamber.

The base plate 110 can be any suitable thickness $T_B$ and have any suitable width $W_B$. In some embodiments, the thickness $T_B$ of the base plate 110 is in the range of 1/32 inch to 1 inch (or 1 mm to 25 mm) thick. In some embodiments, the width $W_B$ of the base plate 110 is in the range of ½ inch to 4 inches (or 12 mm to 100 mm) wide.

The base plate 110 can be made of any suitable material known to the skilled artisan. In some embodiments, the base plate 110 comprises a non-conductive material. In some embodiments, the non-conductive material comprises one or more of acetal, polyacetal, polyformaldehyde, nylon, polytetrafluoroethylene (PTFE), polyether ether ketone (PEEK), polycarbonate, or polyvinyl chloride (PVC).

Figure 6:
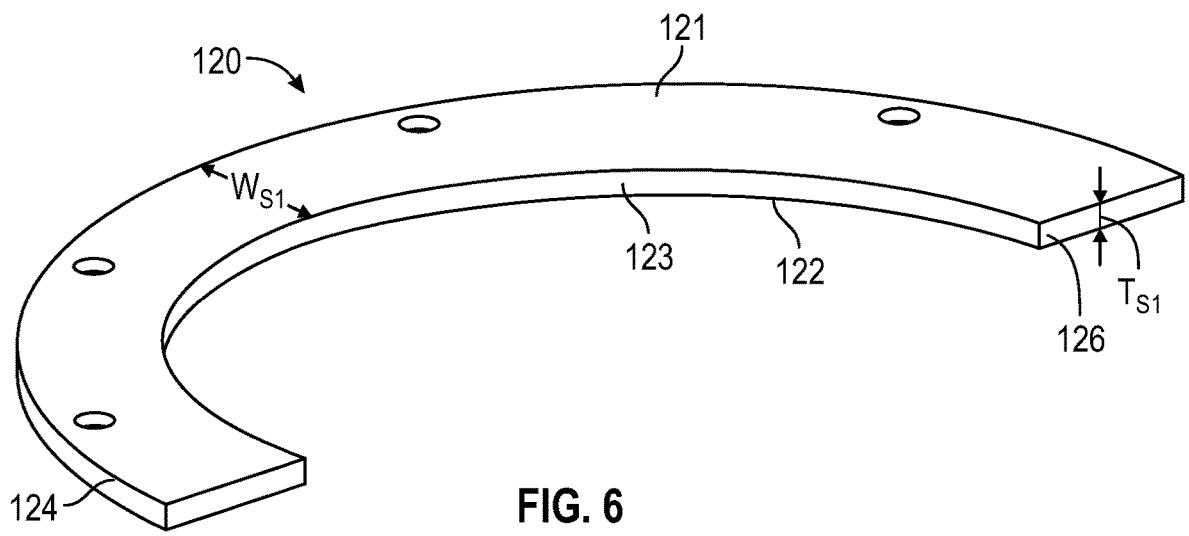
FIG. 6 shows an isometric view of a portion of a shim of a magnet assembly according to one or more embodiment of the disclosure.
Figure 7:
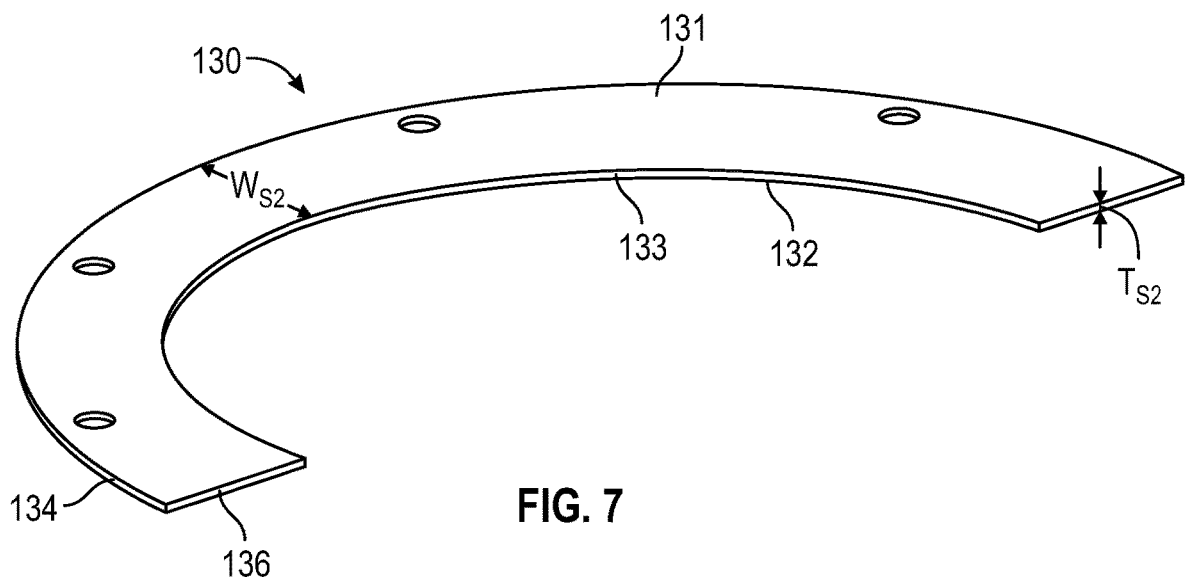
FIG. 7 shows an isometric view of a portion of a shim of a magnet assembly according to one or more embodiment of the disclosure.

In some embodiments, the magnet assembly 100 further comprises at least one optional shim 120, 130. FIG. 6 illustrates a portion of an optional shim 120 in accordance with one or more embodiment of the disclosure. FIG. 7 illustrates a portion of an optional second shim 130 in accordance with one or more embodiment of the disclosure. The shim 120, 130 has a top surface 121, 131 and a bottom surface 122, 132 that define a thickness $T_{S1}$, $T_{S2}$. The shim 120, 130 includes an inner diameter with an inner peripheral face 123, 133 and an outer diameter with an outer peripheral face 124, 134 that define a width $W_{S1}$, $W_{S2}$ of the shim 120, 130.

In some embodiments, the shim 120, 130 comprises more than one piece. For example, the embodiments illustrated in the Figures have two-part shims 120, 130 that can be assembled so that the end faces 126, 136 are positioned to touch, or nearly touch, to form a generally ring-shaped shim component. The split piece shims of some embodiments allow for easy retrofitting of the magnet assembly 100 onto existing process chambers so that components do not need to be removed from the process chambers during assembly.

In some embodiments, the shim 120, 130 comprises at least two portions. For example, two shims 120, 130 like that shown in FIGS. 6 and 7 can be connected to form a single shim 120, 130. In some embodiments, the shim 120, 130 comprises three or four pieces that are connected to form a single shim.

The shims 120, 130 can be any suitable thickness $T_{S1}$, $T_{S2}$ and have any suitable width $W_{S1}$, $W_{S2}$. In some embodiments, the thickness $T_{S1}$, $T_{S2}$ of the shims 120, 130 are independently in the range of 1/32 inch to 1 inch (or 1 mm to 25 mm) thick. In some embodiments, the width $W_{S1}$, $W_{S2}$ of the shims 120, 130 are independently in the range of 1/2 inch to 4 inches (or 12 mm to 100 mm) wide. In some embodiments, the shims 120, 130 have a combined thickness, or a single thickness, sufficient to elevate the housing 140 to a suitable height. In some embodiments, no shims are used between the base plate 110 and the housing 140. In some embodiments, one shim 120 is used between the base plate 110 and the housing 140. In some embodiments, two shims 120, 130 are used between the base plate 110 and the housing 140. In some embodiments, more than two shims are used between the base plate 110 and the housing 140.

The shims 120, 130 can be made of any suitable material known to the skilled artisan. In some embodiments, the shims 120, 130 independently comprise a non-conductive material. In some embodiments, the non-conductive material comprises one or more of acetal, polyacetal, polyformaldehyde, nylon, polytetrafluoroethylene (PTFE), polyether ether ketone (PEEK), polycarbonate, or polyvinyl chloride (PVC).

Figure 8:
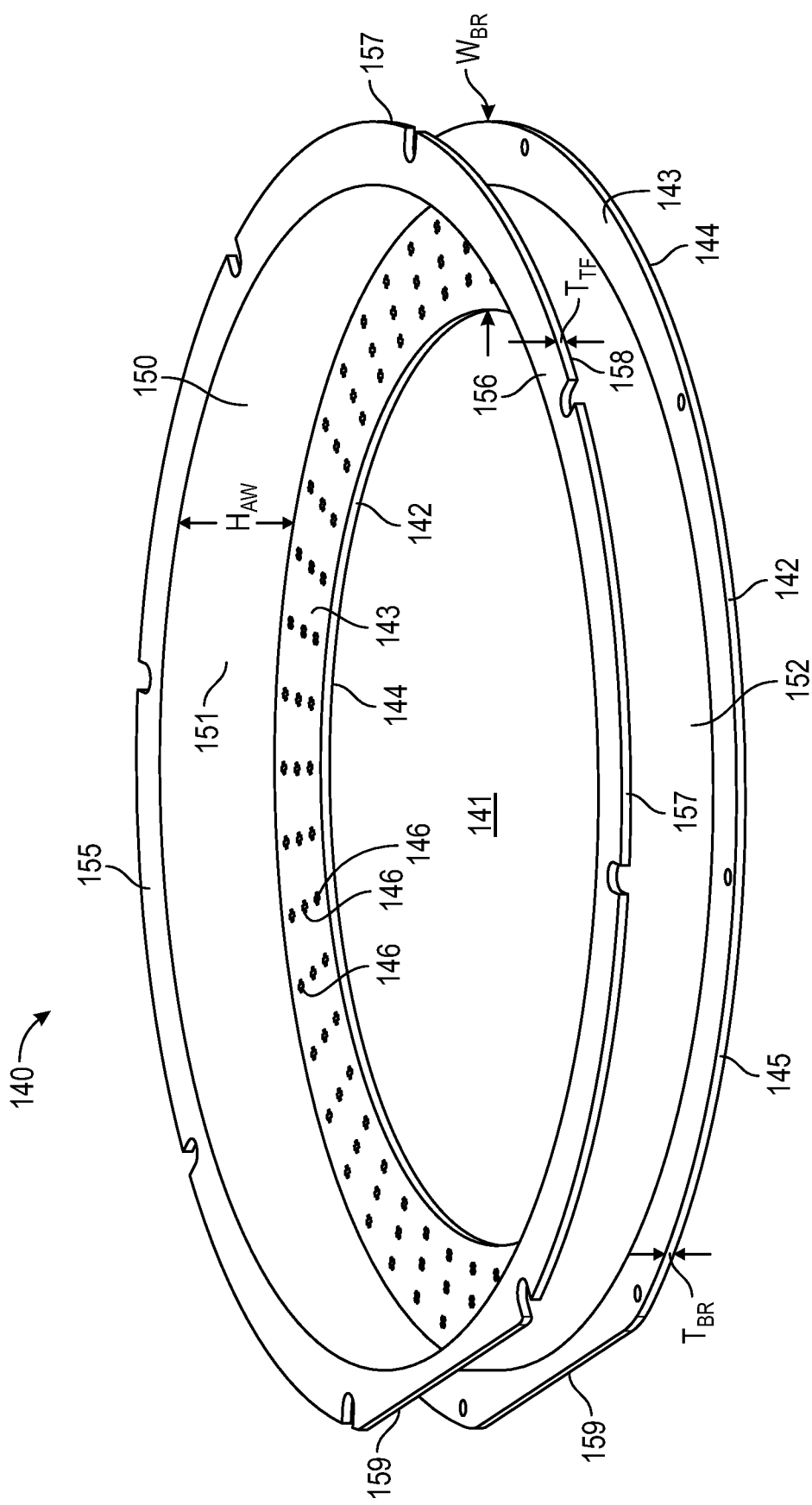
FIG. 8 shows an isometric view of a housing of a magnet assembly according to one or more embodiment of the disclosure.
Figure 9:
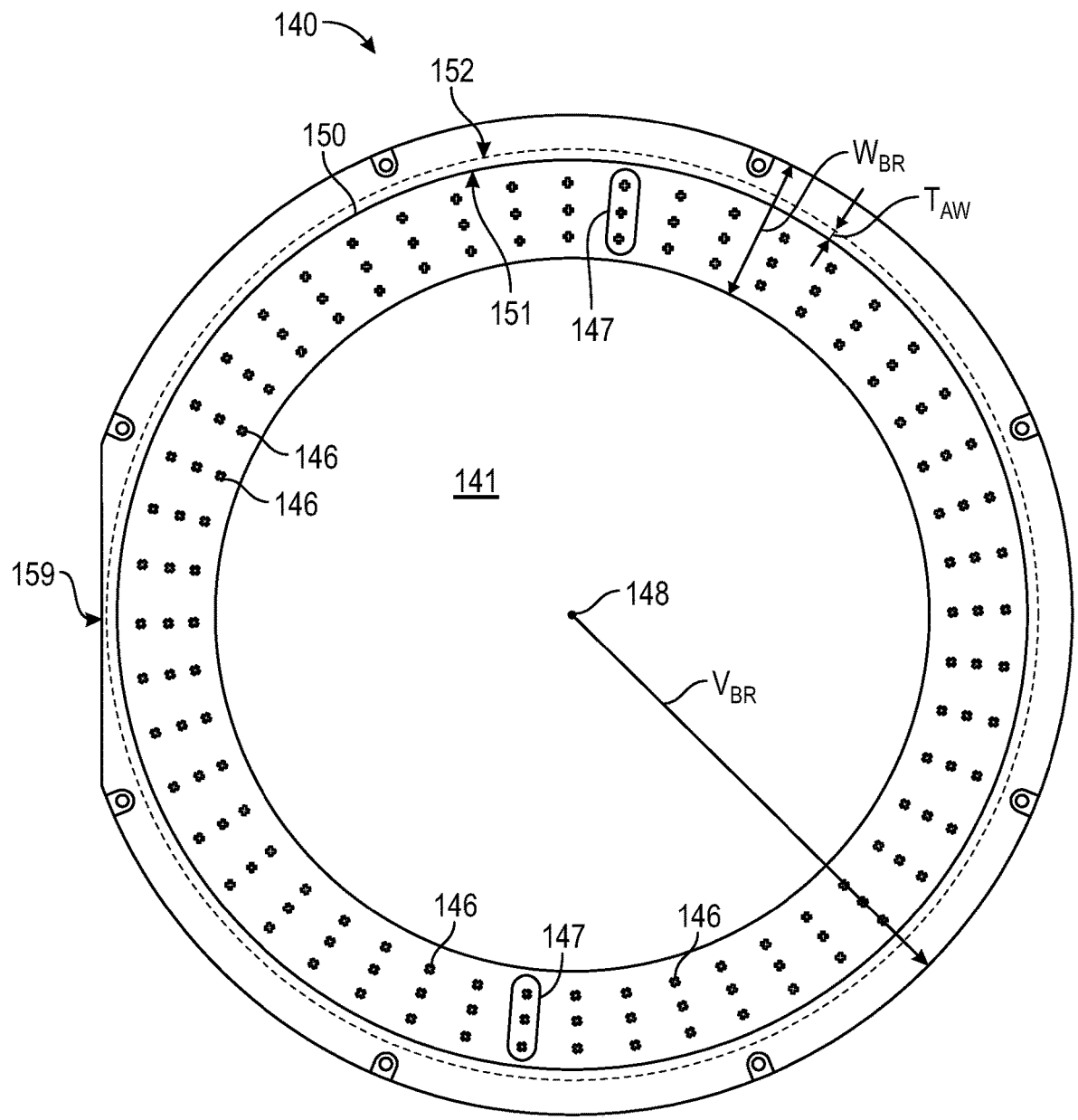
FIG. 9 shows a top plan view of a housing of a magnet assembly according to one or more embodiment of the disclosure.

Some embodiments of the disclosure are directed to housings 140 or magnet assemblies 100 including housings 140. FIG. 8 illustrates a housing 140 in accordance with one or more embodiment of the disclosure. FIG. 9 illustrates a top plan view of a housing 140 in accordance with one or more embodiment of the disclosure. In some embodiments, the housing 140 is a generally ring-shaped component with an open interior 141. The housing 140 of some embodiments is positioned on the base plate 110 either in direct contact with the base plate 110 or with one or more intervening shims 120, 130.

The housing 140 has a bottom ring 142 with a top surface 143 and a bottom surface 144 that define a thickness $T_{BR}$ of the bottom ring 142. The bottom ring 142 has an inner diameter with an inner peripheral face 144 and an outer diameter with an outer peripheral face 145 that define a width $W_{BR}$ of the bottom ring 142. In some embodiments, the thickness $T_{BR}$ of the bottom ring 142 is in the range of 1/16 inch to 1/4 inch (or 1.5 mm to 6 mm). In some embodiments, the width $W_{BR}$ of the bottom ring 142 is in the range of 1 inch to 4 inches (or 25 mm to 100 mm).

The bottom ring 142 has a plurality of openings 146 extending through the thickness $T_{BR}$ of the bottom ring 142. In some embodiments, the openings 146 extend a distance from the top surface 143 of the bottom ring 142 through a portion of the thickness $T_{BR}$ of the bottom ring 142.

The plurality of openings 146 in the housing are arranged in sets 147. Each set 147 of openings 146 are aligned along a vector $V_{BR}$ extending from a center 148 of the bottom ring 142 to the outer peripheral face 145. Each opening in the set of openings is positioned at different distances from the center 148 to form rings of openings 146 with different radii or diameters.

Each set 147 of openings 146 can have any suitable number of openings aligned along the vector $V_{BR}$. In the illustrated embodiment, each set 147 has three openings 146. In some embodiments, there are three openings 146 in each set 147 forming three rings of openings 146 around the center 148, each ring having a different radius from the center 148. In some embodiments, each set 147 comprises two or more openings 146. In some embodiments, each set 147 comprises in the range of two to five openings 146.

The number of sets 147 of openings 146 arranged around the center 148 can vary. In some embodiments, there are in the range of 6 to 120 sets 147 of openings 146. In some embodiments, there are in the range of 12 to 80 sets 147, or 24 to 60 sets 147 of openings 146.

The housing 140 includes a housing annular wall 150 extending a height $H_{AW}$ from the top surface 143 of the bottom ring 142. The housing annular wall 150 has an inner diameter with an inner peripheral face 151 and an outer diameter with an outer peripheral face 152 defining a wall thickness $T_{AW}$. In some embodiments, the thickness $T_{AW}$ of the annular wall 150 in the range of 1/16 inch to 1/4 inch (or 1.5 mm to 6 mm). In some embodiments, the height $H_{AW}$ of the annular wall 150 is in the range of 0.5 inches to 2.5 inches (or 12 mm to 62 mm).

In some embodiments, the housing 140 comprises a top flange 155 on a top of the annular wall 150. The top flange 155 of some embodiments extends outwardly from the outer peripheral face 152 of the annular wall 150. In some embodiments, the top flange 155 extends outwardly to an outer peripheral face 157 that has the same diameter as that of the bottom ring 142. In some embodiments, the thickness $T_{TF}$ of the top flange 155, defined between a top surface 156 and bottom surface 158 of the top flange 157, is in the range of 1/16 inch to 1/4 inch (or 1.5 mm to 6 mm).

In some embodiments, as shown in the Figures, the bottom ring 142 and/or top flange 155 has a truncated portion forming a flat 159 on the outer peripheral face 145, 157. In some embodiments, there is least one truncated portion forming at least one flat 159. In some embodiments, the flat 159 is sized to allow the housing 140 to fit adjacent another component on the process chamber, for example, the interlock switch 210, shown in FIG. 1.

The housing 140 can be made of any suitable material. In some embodiments, the housing 140 comprises a conductive material. In some embodiments, the housing 140 comprises one or more of aluminum or stainless steel.

Figure 10:
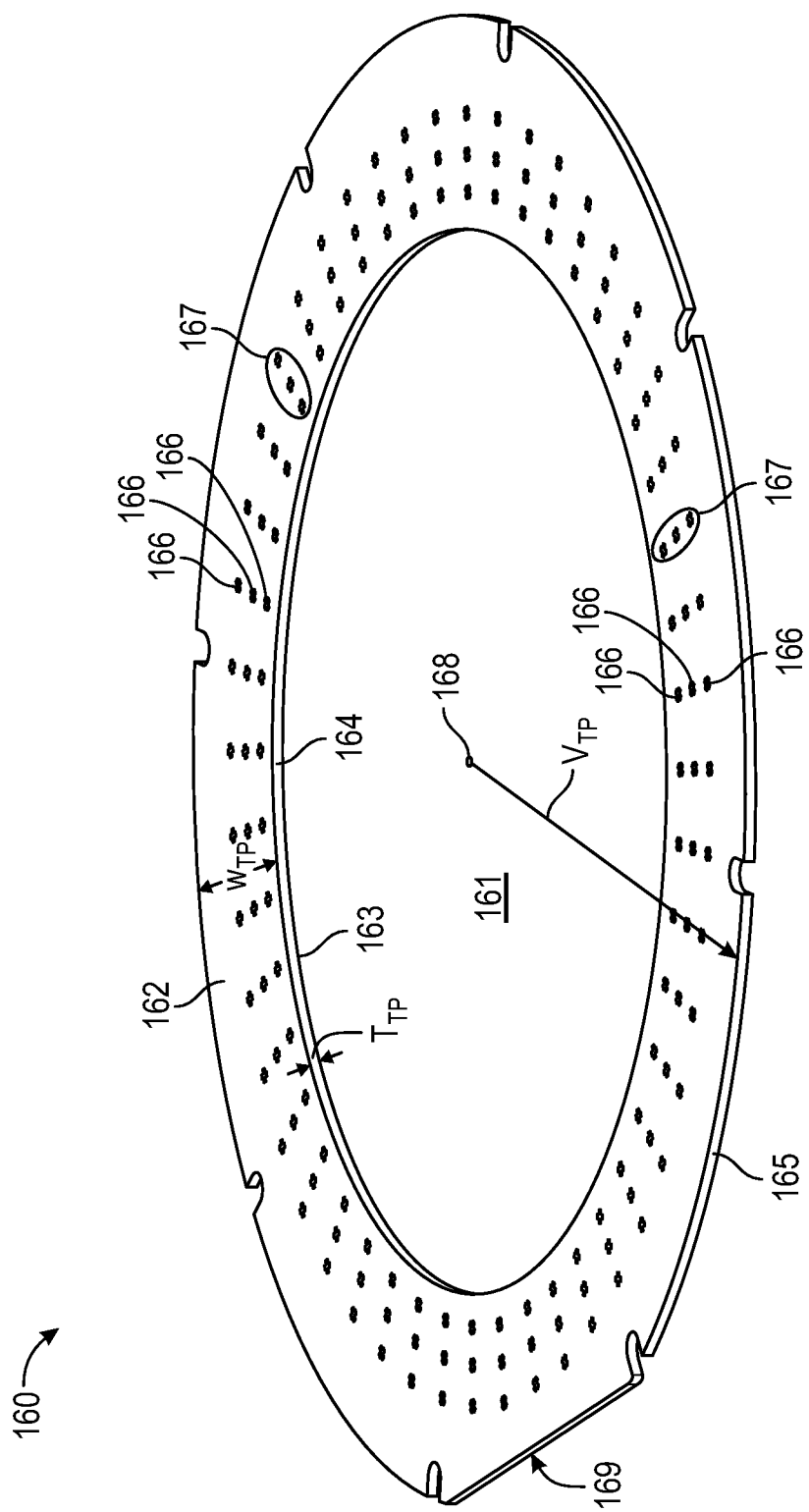
FIG. 10 shows an isometric view of a top plate of a magnet assembly according to one or more embodiment of the disclosure.

In some embodiments, the magnet assembly 100 includes a top plate 160. FIG. 10 illustrates a top plate 160 in accordance with one or more embodiment of the disclosure. The top plate 160 of some embodiments, is positioned on the annular wall 150 of the housing 140. In some embodiments, the top plate 160 is positioned on the top flange 155 of the housing 140.

The top plate 160 is a generally ring-shaped component with an open interior 161. The top plate 160 has a top surface 162 and a bottom surface 163 defining a thickness $T_{TP}$ of the top plate 160. The top plate 160 has inner diameter with an inner peripheral face 164 and an outer diameter with an outer diameter face 165 defining a width $W_{TP}$ of the top plate 160.

The top plate 160 has a plurality of openings 166 extending through the thickness $T_{TP}$ of the top plate 160. In some embodiments, the openings 166 extend from the bottom surface 163 partially through the thickness $T_{TP}$ of the top plate 160 to form recesses in the bottom surface 163. In some embodiments, the thickness $T_{TP}$ of the top plate 160 is in the range of 1/16 inch to 1/4 inch (or 1.5 mm to 6 mm).

The plurality of openings 166 are aligned with the plurality of openings 146 in the bottom ring 142 of the housing 140. In some embodiments, the plurality of openings 166 are arranged in sets 167 aligned with the sets 147 of openings 146 in the housing 140.

The plurality of openings 166 in the top plate 160 are arranged in sets 167. Each set 167 of openings 166 are aligned along a vector $V_{TP}$ extending from a center 168 of the top plate 160 to the outer peripheral face 165. Each opening 166 in the set 167 of openings is positioned at different distances from the center 168 to form rings of openings 166 with different radii or diameters.

Each set 167 of openings 166 can have any suitable number of openings aligned along the vector $V_{TP}$. In the illustrated embodiment, each set 167 has three openings 166. In some embodiments, there are three openings 166 in each set 167 forming three rings of openings 166 around the center 168, each ring having a different radius from the center 168. In some embodiments, each set 167 comprises two or more openings 166. In some embodiments, each set 167 comprises in the range of two to five openings 166.

The number of sets 167 of openings 166 arranged around the center 168 can vary. In some embodiments, there are in the range of 6 to 120 sets 167 of openings 166. In some embodiments, there are in the range of 12 to 80 sets 147, or 24 to 60 sets 167 of openings 166.

In some embodiments, as shown in the Figures, the top plate 160 has a truncated portion forming a flat 169 on the outer peripheral face 165. In some embodiments, there is least one truncated portion forming at least one flat 169. In some embodiments, the flat 169 is sized to allow the top plate 160 to fit adjacent another component on the process chamber, for example, the interlock switch 210, shown in FIG. 1.

The top plate 160 can be made of any suitable material. In some embodiments, the top plate 160 comprises a conductive material. In some embodiments, the top plate 160 comprises one or more of aluminum or stainless steel.

Figure 11:
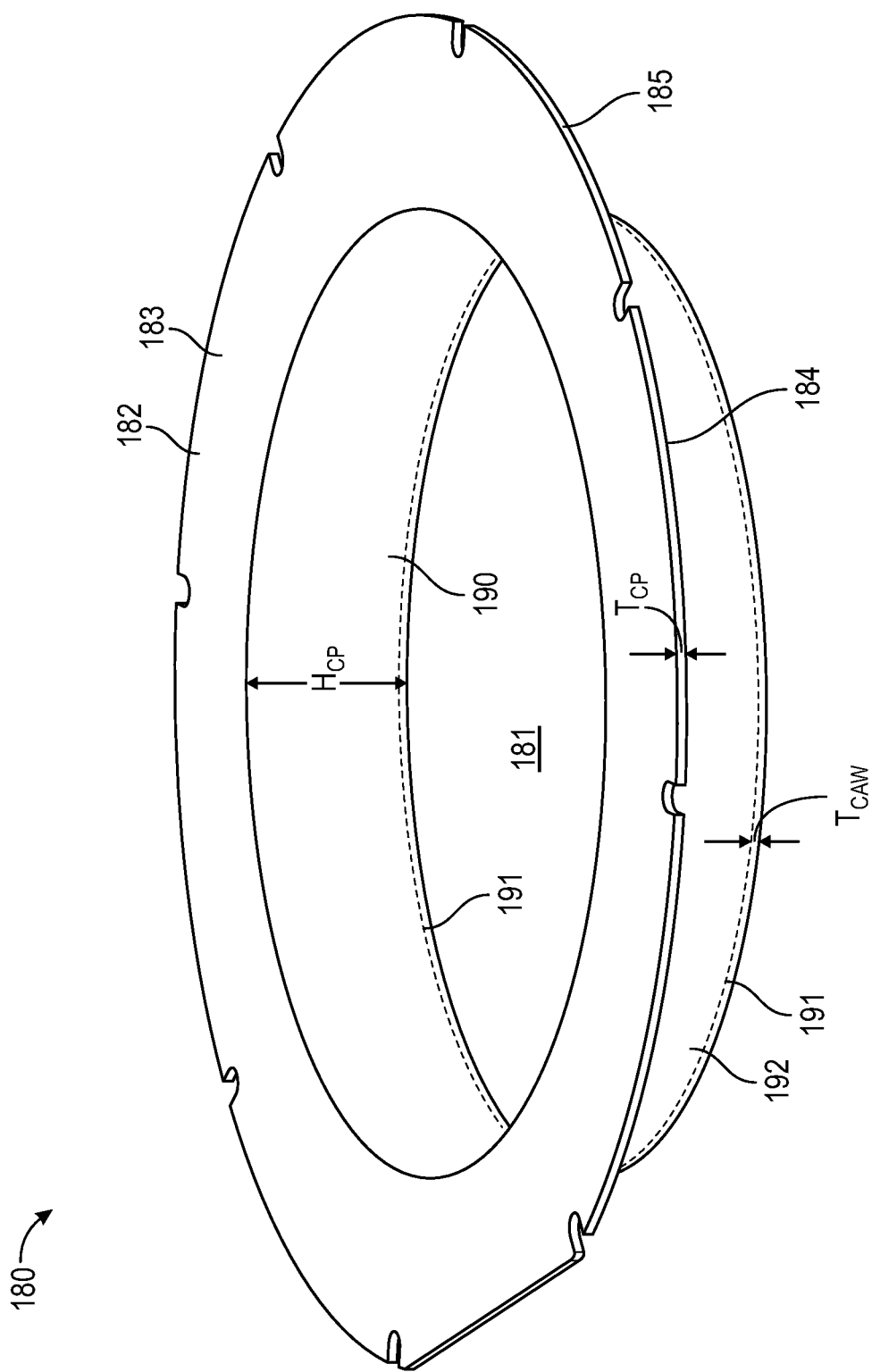
FIG. 11 shows an isometric view of a cover plate of a magnet assembly according to one or more embodiment of the disclosure.

Some embodiments of the magnet assembly 100 include a cover plate 180. FIG. 11 illustrates a cover plate 180 in accordance with one or more embodiment of the disclosure. The cover plate 180 is a generally ring-shaped component with an open interior 181. The cover plate 180 has a cover plate top wall 182 with a cover plate top wall 182 has a top surface 183 and a bottom surface 184 defining a thickness $T_{CP}$ of the cover plate top wall 182. In some embodiments, the thickness $T_{CP}$ of the cover plate 180 is in the range of 1/16 inch to 1/4 inch (or 1.5 mm to 6 mm).

and a cover plate annular wall 190 with an inner diameter with an inner diameter face 191 and an outer diameter with an outer diameter face 192 defining an annular wall thickness $T_{CAW}$. The cover plate annular wall 190 extending a height $H_{CP}$ from the bottom surface 184 of the cover plate top wall 182 and has an outer diameter face 192 outer diameter less than the inner diameter of the inner peripheral face 151 of the housing annular wall 150. In some embodiments, the thickness $T_{CAW}$ of the annular wall 190 is in the range of 1/16 inch to 1/4 inch (or 1.5 mm to 6 mm).

The cover plate 180 can be made of any suitable material. In some embodiments, the cover plate 180 comprises a conductive material. In some embodiments, the cover plate 180 comprises one or more of aluminum or stainless steel.

In some embodiments, as shown in the Figures, the cover plate 180 has a truncated portion forming a flat 189 on the outer peripheral face 185. In some embodiments, there is least one truncated portion forming at least one flat 189. In some embodiments, the flat 189 is sized to allow the cover plate 180 to fit adjacent another component on the process chamber, for example, the interlock switch 210, shown in FIG. 1.

Figure 12:
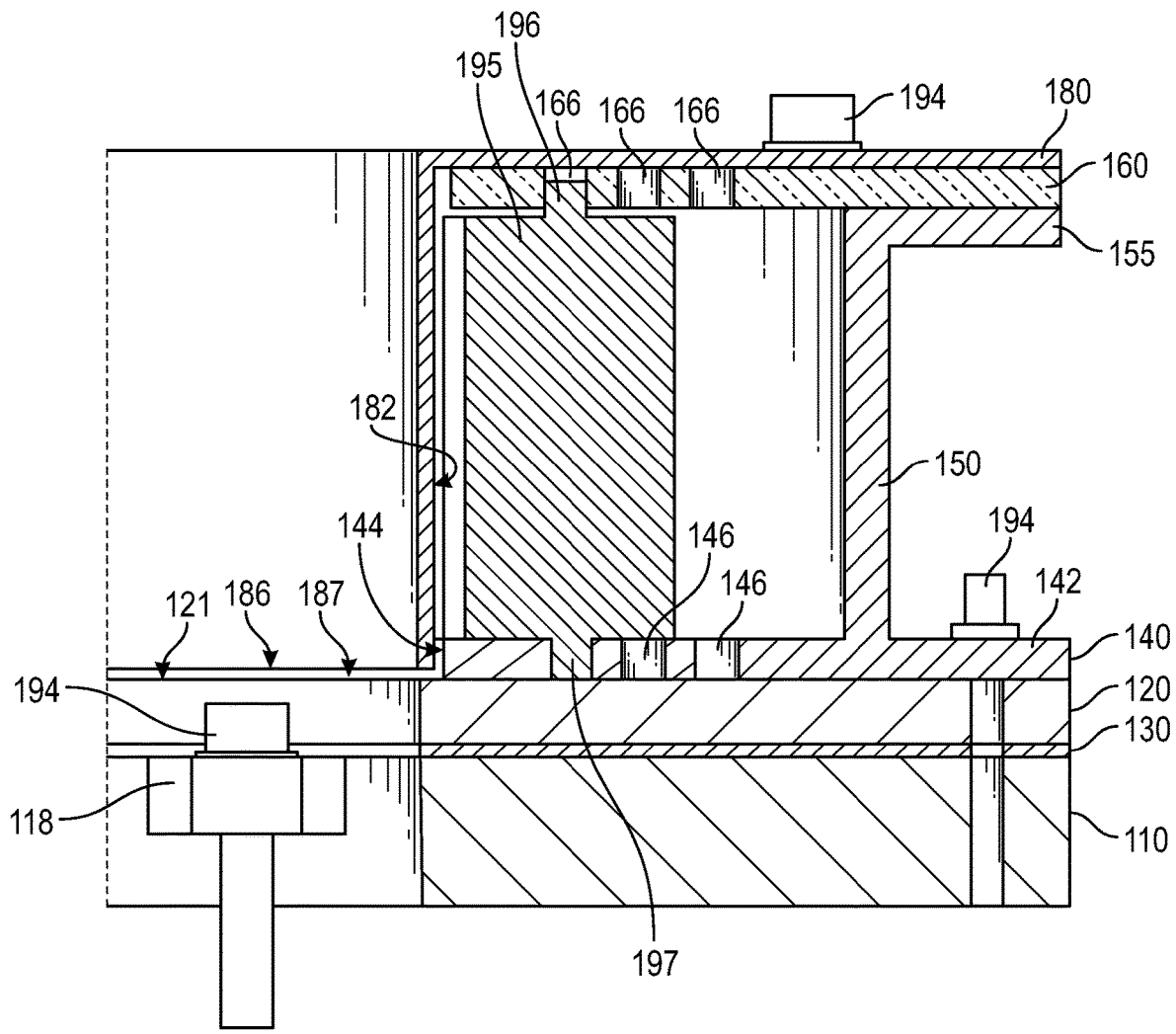
FIG. 12 shows a partial cross-sectional view of a magnet assembly according to one or more embodiment of the disclosure.

Some embodiments of the magnet assembly 100 includes one or more magnets 195. FIG. 12 illustrates a partial cross-sectional view of a magnet assembly 100 in accordance with one or more embodiments of the disclosure. In some embodiments, each set 147 of openings 146 in the housing 140 has a magnet 195. In some embodiments, there are fewer magnets 195 than sets 147 of openings 146 in the housing 140. In some embodiments, the magnets 195 are positioned between the housing 140 and the top plate 160 so that each magnet 195 is aligned with openings 146, 166 in the housing 140 and top plate 160. In some embodiments, the magnets 195 include a top protrusion 196 and a bottom protrusion 197 that fit into opening 166 and opening 146, respectively.

When assembled, as shown in FIG. 12, according to some embodiments, the bottom 186 of the cover plate 180 is a distance 187 from the top surface 121 of the shim 120 (or top surface 111 of the base plate 110 if no shim 120 is present). In some embodiments, the distance 187 is in the range of 0.01 inch to 0.1 inch (or 0.25 mm to 2.5 mm). In some embodiments, when assembled, the outer peripheral face 182 of the cover plate 180 is spaced a distance from the inner peripheral face 144 of the housing 140 by an amount in the range of 0.005 inch to 0.05 inch (or 0.125 mm to 1.25 mm). The magnet assembly 100 of some embodiments is held together using one or more physical connector 194 (e.g., bolts or screws).

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A magnet assembly comprising:
   one or more magnets; and
   a housing having a bottom ring with a top surface and a bottom surface defining a thickness of the bottom ring, an inner diameter with an inner peripheral face and an outer diameter with an outer peripheral face, the bottom ring having a plurality of openings extending through the thickness of the bottom ring, and a housing annular wall extending a height from the top surface of the bottom ring, the housing annular wall having an inner diameter with an inner peripheral face and an outer diameter with an outer peripheral face defining a wall thickness, and a top flange on a top of the housing annular wall, the top flange extending outwardly from the outer peripheral face of the housing annular wall.

2. The magnet assembly of claim 1, wherein the plurality of openings are arranged in sets, each set of openings aligned along a vector extending from a center of the bottom ring to the outer peripheral face of the bottom ring, each opening of each set of openings positioned at different distances from the center.

3. The magnet assembly of claim 2, wherein there are three openings in each set of openings forming three rings of holes around the center, each ring having a different radius from the center.

4. The magnet assembly of claim 2, wherein there are in the range of 24 to 60 sets of openings.

5. The magnet assembly of claim 1, wherein the bottom ring has a truncated portion forming a flat on the outer peripheral face.

6. The magnet assembly of claim 1, wherein the height of the housing annular wall is in the range of 0.5 to 2.5 inches.

7. The magnet assembly of claim 1, wherein the housing comprises aluminum.

8. The magnet assembly of claim 1, wherein the thickness of the bottom ring and the wall thickness of the annular wall are in the range of 1/16 inch to 1/4 inch.

9. A magnet assembly comprising:
   one or more magnets;
   a base plate having a top surface and a bottom surface defining a thickness of the base plate;
   a housing on the base plate, the housing having a bottom ring with a top surface and a bottom surface defining a thickness of the bottom ring, an inner diameter with an inner peripheral face and an outer diameter with an outer peripheral face, the bottom ring having a plurality of openings extending through the thickness of the bottom ring, and a housing annular wall extending a height from the top surface of the bottom ring, the housing annular wall having an inner diameter with an inner peripheral face and an outer diameter with an outer peripheral face defining a wall thickness;
   a top plate on the housing, the top plate having a top surface and a bottom surface defining a thickness of the top plate, and an inner diameter with an inner peripheral face and an outer diameter with an outer diameter face, the top plate having a plurality of openings extending through the thickness of the top plate, the plurality of openings aligned with the plurality of openings in the bottom ring of the housing; and
   a cover plate having a cover plate top wall and a cover plate annular wall, the cover plate top wall having a top surface and a bottom surface defining a thickness of the cover plate top wall, the cover plate annular wall having an inner diameter with an inner diameter face and an outer diameter with an outer diameter face defining a wall thickness, the cover plate annular wall extending a height from the bottom surface of the cover plate top wall and having an outer diameter less than the inner diameter of the housing annular wall.

10. The magnet assembly of claim 9, wherein the plurality of openings in the housing are arranged in sets, each set of openings aligned along a vector extending from a center of the bottom ring to the outer peripheral face of the bottom ring, each opening of each set of openings positioned at different distances from the center, and the plurality of openings in the top plate are arranged in sets aligned with the sets of openings in the housing.

11. The magnet assembly of claim 10, wherein there are three openings in each set of openings forming three rings of openings around the center, each ring of openings having a different radius from the center.

12. The magnet assembly of claim 10, wherein there are in the range of 24 to 60 sets of openings.

13. The magnet assembly of claim 10, wherein the height of the housing annular wall is in the range of 0.5 to 2.5 inches.

14. The magnet assembly of claim 9, wherein the base plate comprises at least two portions that when assembled form a ring-shaped base plate.

15. The magnet assembly of claim 9, wherein the base plate comprises a non-conductive material, the housing comprises aluminum, the top plate comprises stainless steel and the cover plate comprises aluminum.

16. The magnet assembly of claim 9, further comprising at least one shim between the base plate and the housing.

17. The magnet assembly of claim 16, wherein each of the at least one shim comprises at least two portions that when assembly assembled form a ring-shaped shim.

18. The magnet assembly of claim 16, further comprising a top flange on a top of the housing annular wall, the top flange extending outwardly from the outer peripheral face of the housing annular wall.

19. The magnet assembly of claim 9, further comprising a plurality of magnets positioned between the housing and the top plate, each of the magnets positioned within aligned openings in the housing and the top plate.

* * * * *